US011799031B2

(12) United States Patent
Xing et al.

(10) Patent No.: US 11,799,031 B2
(45) Date of Patent: Oct. 24, 2023

(54) FIELD-EFFECT TRANSISTOR

(71) Applicant: United Microelectronics Corp., Hsinchu (TW)

(72) Inventors: Su Xing, Singapore (SG); Chung Yi Chiu, Tainan (TW); Hai Biao Yao, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 41 days.

(21) Appl. No.: 17/705,380

(22) Filed: Mar. 27, 2022

(65) Prior Publication Data
US 2022/0216345 A1 Jul. 7, 2022

Related U.S. Application Data

(62) Division of application No. 16/907,001, filed on Jun. 19, 2020, now Pat. No. 11,329,161.

(30) Foreign Application Priority Data

May 11, 2020 (CN) .......................... 202010391505.0

(51) Int. Cl.
*H01L 21/8232* (2006.01)
*H01L 21/762* (2006.01)
(Continued)

(52) U.S. Cl.
CPC .... *H01L 29/78603* (2013.01); *H01L 21/2253* (2013.01); *H01L 21/762* (2013.01);
(Continued)

(58) Field of Classification Search
CPC ........... H01L 29/78603; H01L 29/0653; H01L 29/66772; H01L 29/749; H01L 29/4983;
(Continued)

(56) References Cited

U.S. PATENT DOCUMENTS 4,809,056 A 2/1989 Shirato et al.
6,521,948 B2 2/2003 Ebina
(Continued)

FOREIGN PATENT DOCUMENTS

CN 101626031 1/2010
JP 2004303911 10/2004

OTHER PUBLICATIONS

Donald Sadoway, "MIT 3.091 Introduction to Solid State Chemistry, Fall 2004, Lecture Notes No. 9, Diffusion," MIT OpenCourseWare, Dec. 2004, pp. 1-15.
(Continued)

*Primary Examiner* — Galina G Yushina
(74) *Attorney, Agent, or Firm* — JCIPRNET

(57) ABSTRACT

A structure of field-effect transistor includes a silicon layer of a silicon-on-insulator structure. A gate structure layer in a line shape is disposed on the silicon layer, wherein the gate structure layer includes a first region and a second region abutting to the first region. Trench isolation structures in the silicon layer are disposed at two sides of the gate structure layer, corresponding to the second region. The second region of the gate structure layer is disposed on the silicon layer and overlaps with the trench isolation structure. A source region and a drain region are disposed in the silicon layer at the two sides of the gate structure layer, corresponding to the first region. The second region of the gate structure layer includes a conductive-type junction portion.

1 Claim, 4 Drawing Sheets

(51) Int. Cl.
  *H01L 29/749* (2006.01)
  *H01L 29/786* (2006.01)
  *H01L 29/66* (2006.01)
  *H01L 29/06* (2006.01)
  *H01L 21/225* (2006.01)

(52) U.S. Cl.
  CPC ...... *H01L 21/8232* (2013.01); *H01L 29/0653* (2013.01); *H01L 29/66772* (2013.01); *H01L 29/749* (2013.01)

(58) Field of Classification Search
  CPC ......... H01L 29/78615; H01L 29/88654; H01L 29/78651; H01L 29/4908; H01L 29/66749
  See application file for complete search history.

(56) References Cited

U.S. PATENT DOCUMENTS

| | | | |
|---|---|---|---|
| 2002/0079544 A1 | 6/2002 | Shino | |
| 2003/0052347 A1 | 3/2003 | Fung | |
| 2005/0072975 A1* | 4/2005 | Chen | H01L 29/4908 257/E29.151 |
| 2010/0081239 A1* | 4/2010 | Min | H01L 21/26506 438/151 |
| 2012/0146146 A1* | 6/2012 | Anderson | H01L 21/26513 257/E21.415 |
| 2020/0127108 A1* | 4/2020 | Chern | H01L 21/266 |

OTHER PUBLICATIONS

"Notice of allowance of China Counterpart Application", dated Jul. 10, 2023, p. 1-p. 3.

* cited by examiner

FIELD-EFFECT TRANSISTOR

CROSS-REFERENCE TO RELATED APPLICATION

This application is a divisional application of and claims the priority benefit of U.S. application Ser. No. 16/907,001, filed on Jun. 19, 2020, now allowed, which claims the priority benefit of Chinese application serial no. 202010391505.0, filed on May 11, 2020. The entirety of each of the above-mentioned patent applications is hereby incorporated by reference herein and made a part of this specification.

BACKGROUND OF THE INVENTION

Field of the Invention

The invention relates to a semiconductor fabrication technology, in particular, to a structure for field-effect transistor and the fabrication method thereof.

Description of Related Art

In development for the semiconductor fabrication technology, the fabrication process may take the silicon-on-insulator (SOI) substrate for fabricating the semiconductor devices. The SOI substrate has a thin semiconductor layer, such as silicon layer, to provide the semiconductor properties of the device, such as providing the channel effect of a field effect transistor.

As to the conventional way in taking the SOI substrate to fabricate the field effect transistor, the silicon layer under the gate structure at two sides of the gate structure includes a source region, a drain region and a body region between the source region and the drain region. The body region provides the channel of the transistor.

As to the fabrication based on the SOI substrate, the voltage at the body region may be a floating state, which may result in instable state for the threshold voltage of the transistor and then affects the performance of the transistor. The way to avoid the floating state for the voltage at the body region may apply by a voltage to control the threshold voltage.

The usually manner may form a conductive-type junction portion at the end part of the gate layer in the gate structure. Taking N-type metal-oxide-silicon (MOS) transistor as an example, the gate layer is N type and a little region at the end part of the gate layer is another conductive type, such as P type, so an NP junction is produced to serve as a resistor for providing a resistance effect. In association with the voltage at the body region, the NP junction may improve the operation performance of the field effect transistor on the SOI substrate. Likewise, the P type MOS transistor may form the PN junction.

Usually, to fabricate the structure of the NP junction or PN junction for the gate electrode, the region as formed for another conductive type may consume large device area. If the transistor is applied to the circuit in memory devices, due to a large number of devices being involved, the increase in use of the area to produce the NP junction after accumulation may substantially occupy the device area.

Based on the SOI substrate in fabrication, how to properly form the NP junction or the PN junction at the gate structure is still one of the factors for consideration in developing the fabricating technology.

SUMMARY OF THE INVENTION

The invention provides the structure of field effect transistor and the fabrication thereof, in fabrication based on the SOI substrate as a base, the conductive-type junction portion of NP or PN may be effectively formed at the gate structure, so as to provide the resistor effect.

In an embodiment, the invention provides a structure of field-effect transistor, including a silicon layer of a silicon-on-insulator (SOI) structure. A gate structure layer in a line shape is disposed on the silicon layer, wherein the gate structure layer includes a first region and a second region abutting to the first region. Trench isolation structures in the silicon layer are disposed at two sides and of the gate structure layer and corresponding to the second region, wherein the second region of the gate structure layer is disposed on the silicon layer and overlaps with the trench isolation structure. A source region and a drain region are disposed in the silicon layer at the two sides of the gate structure layer and corresponding to the first region. The second region of the gate structure layer includes a conductive-type junction portion.

In an embodiment, as to the field-effect transistor, the second region of the gate structure layer includes a first portion and a second portion, the first region and the first portion of the second region of the gate structure layer are a first conductive type and the second portion is a second conductive type and abuts to the first portion.

In an embodiment, as to the field-effect transistor, the silicon layer includes a well region of the first conductive type under the first region of the gate structure layer and a first portion of the second region of the gate structure layer. In addition, a diffusion region of the first conductive type is under the second portion of the second region of the gate structure layer. A terminal region of the first conductive type is abutting to the diffusion region and disposed at outside of the gate structure layer.

In an embodiment, as to the field-effect transistor, it further includes a connection structure on the terminal region.

In an embodiment, as to the field-effect transistor, a first dopant concentration of the terminal region is higher than a second dopant concentration of the well region, and a third dopant concentration of the diffusion region is between the first dopant concentration and the second dopant concentration.

In an embodiment, as to the field-effect transistor, a distance between the two trench isolation structures at the two sides and corresponding to the second region of the gate structure layer is smaller than a line width of the first region of the gate structure layer.

In an embodiment, as to the field-effect transistor, a ratio of the distance to the line width is in a range of 0.5 to 0.6.

In an embodiment, as to the field-effect transistor, the gate structure layer includes a gate insulating layer and a gate layer as stacked.

In an embodiment, as to the field-effect transistor, the gate layer is a polysilicon layer.

In an embodiment, as to the field-effect transistor, the conductive-type junction portion at the second region of the gate structure layer is a NP junction portion or a PN junction portion depending on a conductive type of the first region of the gate structure layer.

In an embodiment, the invention also provides a method for fabricating a field-effect transistor. The method includes providing a silicon layer, wherein a portion of silicon layer is between adjacent two trench isolation structures. Further, a gate structure layer in a line shape is formed on the silicon layer, including a first region and a second region abutting to the first region, the second region of the gate structure layer overlapping with and covering on the silicon layer and the trench isolation structures. The trench isolation structures are in the silicon layer and at two sides of the gate structure layer corresponding to the second region, wherein the second region of the gate structure layer has a first portion and a second portion sequentially from the first region. A first implanting process is performed to implant first-type dopants at least into the second portion of the second region of the gate structure layer. A second implanting process is performed to implant second-type dopants into the silicon layer to form source and second regions, and to implant the second-type dopants into the first region and the first portion of the second region of the gate structure layer, wherein the gate structure layer except the second portion of the second region is also implanted to form a conductive-type junction portion at the second region.

In an embodiment, as to the method for fabricating the field-effect transistor, the second portion of the second region of the gate structure layer is a first conductive type, wherein the first region and the first portion of the second region of the gate structure layer are a second conductive type.

In an embodiment, as to the method for fabricating the field-effect transistor, the silicon layer as provided includes a well region of the first conductive type under the first region of the gate structure layer and the first portion of the second region of the gate structure layer. A diffusion region of the first conductive type under the second portion of the second region of the gate structure layer. A terminal region of the first conductive type abutting to the diffusion region and at outside of the gate structure layer.

In an embodiment, as to the method for fabricating the field-effect transistor, it further includes forming a connection structure on the terminal region.

In an embodiment, as to the method for fabricating the field-effect transistor, a first dopant concentration of the terminal region is higher than a second dopant concentration of the well region, and a third dopant concentration of the diffusion region is between the first dopant concentration and the second dopant concentration.

In an embodiment, as to the method for fabricating the field-effect transistor, a distance between the two trench isolation structures at the two sides of the gate structure layer and corresponding to the second region is smaller than a line width of the first region of the gate structure layer.

In an embodiment, as to the method for fabricating the field-effect transistor, a ratio of the distance to the line width is in a range of 0.5 to 0.6.

In an embodiment, as to the method for fabricating the field-effect transistor, the gate structure layer as formed includes a gate insulating layer and a gate layer as stacked.

In an embodiment, as to the method for fabricating the field-effect transistor, the gate layer is a polysilicon layer.

In an embodiment, as to the method for fabricating the field-effect transistor, the conductive-type junction portion at the second region of the gate structure layer is a NP junction portion or a PN junction portion depending on a conductive type of the first region of the gate structure layer.

In an embodiment, the invention also provides a structure of field-effect transistor including a silicon layer of a silicon-on-insulator structure. A gate structure layer in a line shape is disposed on the silicon layer, wherein the gate structure layer includes a first region and a second region abutting to the first region. Trench isolation structures are in the silicon layer and disposed at two sides of the gate structure layer and corresponding to the second region, wherein the second region of the gate structure layer is on the silicon layer and overlaps with the trench isolation structure. A source region and a drain region are disposed in the silicon layer at the two sides of the gate structure layer and corresponding to the first region. The first region and the second region of the gate structure layer are in different conductive type.

In order to make the aforementioned and other objectives and advantages of the present invention comprehensible, embodiments accompanied with figures are described in detail below.

DESCRIPTION OF THE EMBODIMENTS

The invention is directed to a structure for field-effect transistor and the fabrication method thereof. The field effect transistor in an example is fabricated based on the SOI substrate. A conductive-type junction may be formed on the gate structure of the transistor, so to provide the resistor effect and may reduce the instable phenomenon caused by the floating voltage at the silicon layer for providing the channel.

Multiple embodiments are provided for describing the invention. However, the invention is not just limited to the embodiments as provided. In addition, a combination in the embodiments may be made, without limiting to the individual embodiments.

Figure 1:
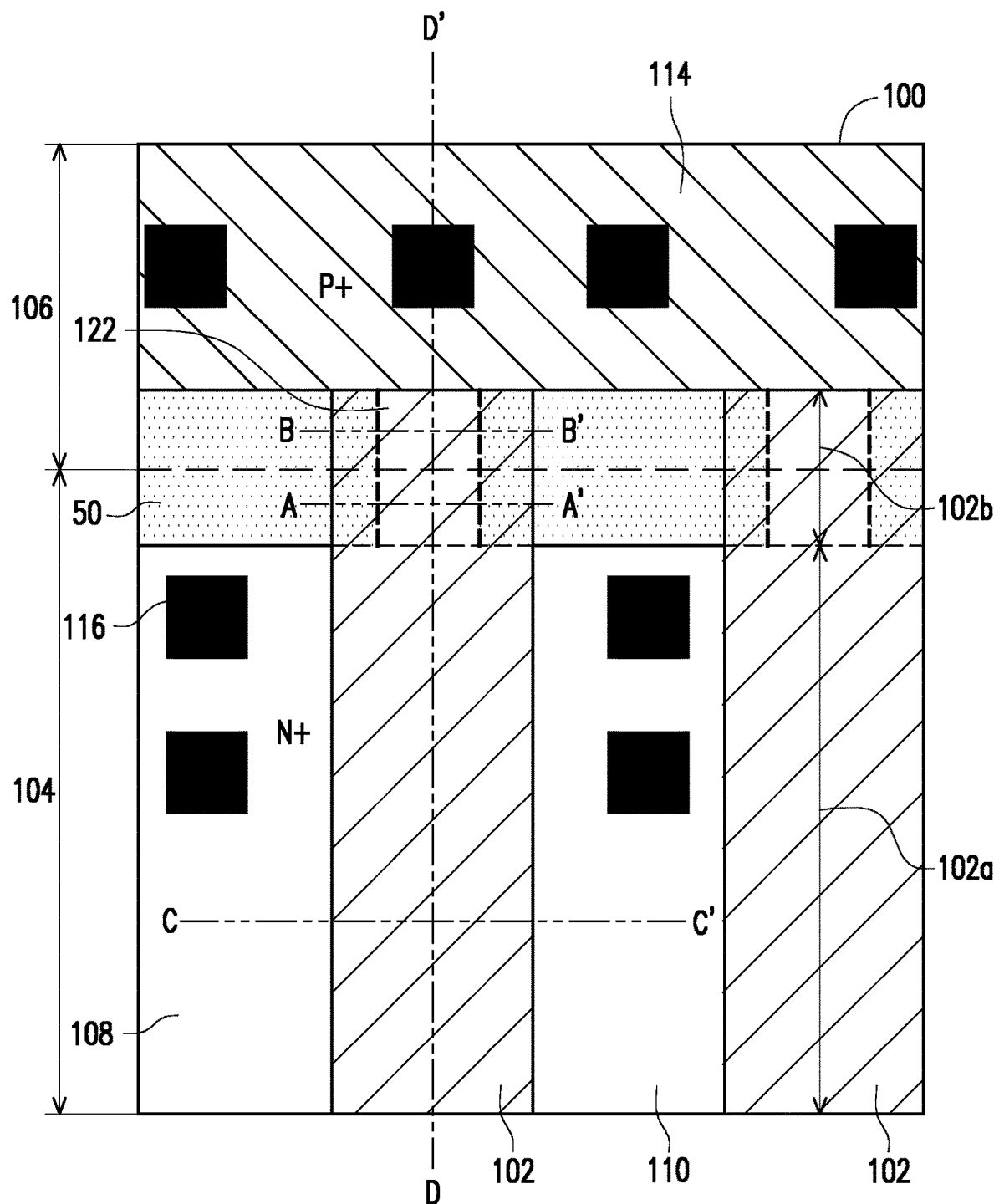
FIG. 1 is a drawing, schematically illustrating a top perspective view of a structure of field effect transistor, according to an embodiment of the invention.
Figure 2:
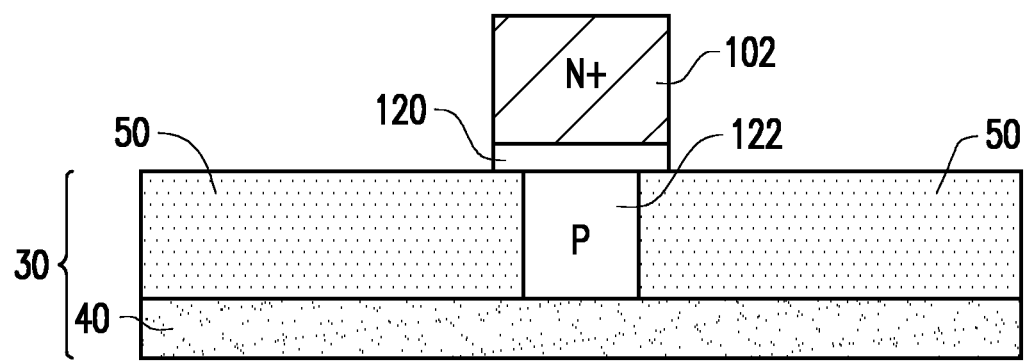
FIG. 2 is a drawing, schematically illustrating a cross-sectional structure in FIG. 1 at the cutting line A-A', according to an embodiment of the invention.
Figure 3:
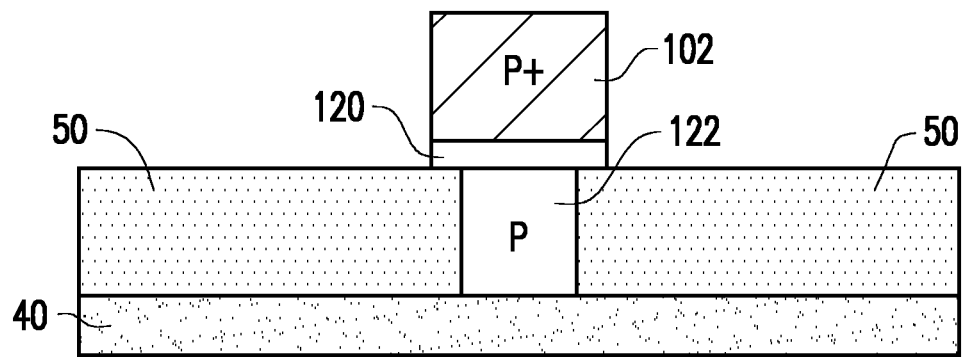
FIG. 3 is a drawing, schematically illustrating a cross-sectional structure in FIG. 1 at the cutting line B-B', according to an embodiment of the invention.
Figure 4:
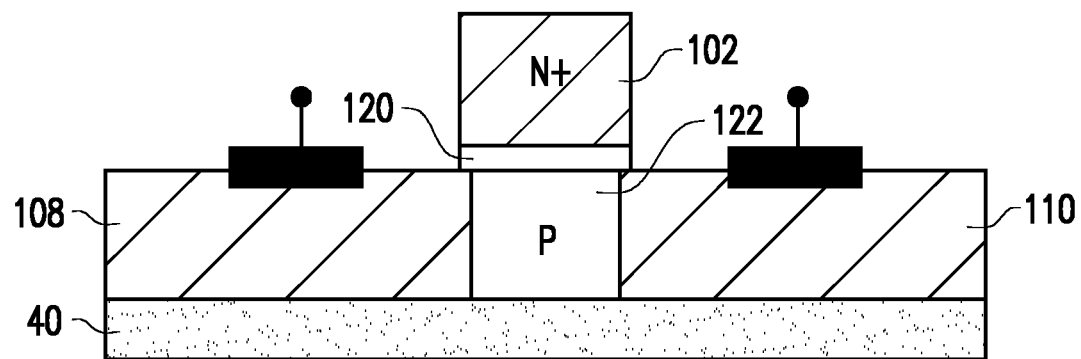
FIG. 4 is a drawing, schematically illustrating a cross-sectional structure in FIG. 1 at the cutting line C-C', according to an embodiment of the invention.
Figure 5:
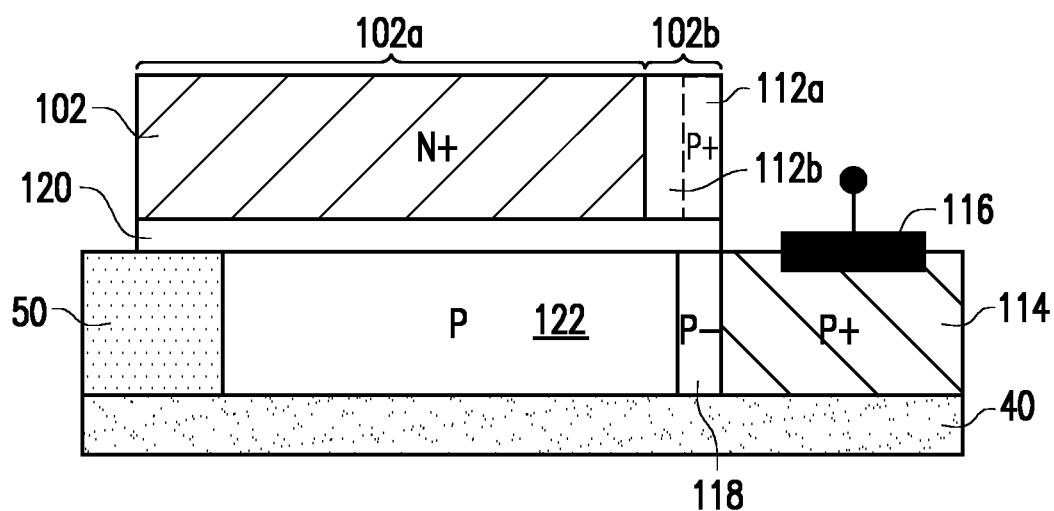
FIG. 5 is a drawing, schematically illustrating a cross-sectional structure in FIG. 1 at the cutting line D-D', according to an embodiment of the invention.

FIG. 1 is a drawing, schematically illustrating a top perspective view of a structure of field effect transistor, according to an embodiment of the invention. FIG. 2 is a drawing, schematically illustrating a cross-sectional structure in FIG. 1 at the cutting line A-A', according to an embodiment of the invention. FIG. 3 is a drawing, schematically illustrating a cross-sectional structure in FIG. 1 at the cutting line B-B', according to an embodiment of the invention. FIG. 4 is a drawing, schematically illustrating a cross-sectional structure in FIG. 1 at the cutting line C-C', according to an embodiment of the invention. FIG. 5 is a drawing, schematically illustrating a cross-sectional structure in FIG. 1 at the cutting line D-D', according to an embodiment of the invention.

Referring to FIG. 1 and FIG. 2 or FIG. 1 and FIG. 3, in an embodiment, the structure of field effect transistor includes a silicon layer 100 of a SOI substrate 30. The doping manner in FIG. 2 and FIG. 3 would be described later. As to the usual SOI substrate 30, it includes an insulating layer 40 and the silicon layer 100 on the insulating layer 40. Generally, the insulating layer 40 is firstly formed on a base substrate in an example and the descriptions thereof are omitted here. The silicon layer 100 being relatively thin is formed on the insulating layer 40. The silicon layer 100 may be preliminarily doped. Taking the N-type transistor as an example, the silicon layer 100 is preliminarily doped into P type. A P-type doped region 122 in the silicon layer 100 under the gate structure 102, that is a doped well region, includes the channel region of the transistor.

The silicon layer 100 may also have other dopes region 114 according to the actual need and a trench isolation structure 50 may also be formed in the silicon layer 100. In addition, the connection structure 116 may also be formed at the corresponding region, so as to provide the operation voltage. The invention is not limited to the embodiments as provided. The descriptions in further detail are as follows.

In an embodiment, a gate structure layer 102 in line shape is disposed on the silicon layer 100. The gate structure layer 102 includes a first region 102a and a second region 102b abutting to the first region 102a. The first region 102a of the gate structure layer 102 is the main part for the transistor. Here, the gate structure layer 102 in an example includes gate layer of polysilicon and gate insulating layer 120. Source/drain doped regions 108, 110 would be formed later in the silicon layer 100 at two sides of the gate structure layer 102, to provide the source region 108 and the drain region 110 as needed by the transistor, as to be described later in further detail.

In an embodiment, the second region 102b of the gate structure layer 102 in an example is used to form the conductive-type junction, such as NP junction in a structure as shown in FIG. 5 later, so as to provide as a resistor.

Trench isolation structure 50 may be formed in the silicon layer 100 to define out the doped regions in the silicon layer 100 as needed. In an embodiment, the second region 102b of the gate structure layer 102 remains the same line width. In this case, the second region 102b of the gate structure layer 102 does not laterally extend out. There is no need to occupy more device area. The second region 102b is reserved to form the resistor later, not for providing the main body of the transistor. As viewed from the cross-sectional structure in FIG. 2 or FIG. 3, the trench isolation structure 50 is extending below the gate structure layer 102, and overlapping with the gate structure layer 102.

After forming the gate structure layer 102 of the transistor in completion, an implanting process may be subsequently performed to implant the dopants with the intended conductive type into the silicon layer 100 and the gate structure layer 102 at the predetermined region. The silicon layer 100 generally may be divided into a first doped region 104 and a second doped region 106. The doped region 104 and the second doped region 106 are doped in different conductive types. Taking the N-type transistor as an example, the doped region 104 is corresponding to the main body of the transistor and doped with the N-type dopants. The second doped region 106 are then doped by the P-type dopants.

In an embodiment, the interface between the doped region 104 and the second doped region 106 is located under the second region 102b of the gate structure layer 102. Thus, the second region 102b of the gate structure layer 102 may be formed with a NP junction. The doping structure may refer to cross-section structures in FIG. 2 to FIG. 5, respectively cutting on the line AA', BB', CC', and DD'.

As shown in FIG. 2, the first region 102a of the gate structure layer 102 is corresponding to the first doped region 104 and then the conductive type of the gate structure layer 102 at the first region 102a in an embodiment is N type, in which the dopant concentration is represented as N+. As shown in FIG. 3, the second region 102b of the gate structure layer 102 is corresponding to the second doped region 106. As a result, the conductive type for the second region 102b of the gate structure layer 102 is P type, in which the dopant concentration is represented by P+. The dopes region 122 in the silicon layer 102 is covered by the gate structure layer 102 to serve as the channel region of transistor, remaining the P conductive type.

Referring to FIG. 1 and FIG. 4, alone the cutting line CC', the source/drain doped regions 108, 110 are within the range of the first doped region 104, as the N conductive type. The dopant concentration is N+ as need of source/drain doped regions 108, 110. The source/drain doped region 108, 110 are disposed at two sides of the of the gate structure layer 102. Based on the fabrication on the SOI substrate, the source/drain doped region 108, 110 are also a part of the silicon layer 100, abutting to the doped region 122.

Referring to FIG. 1 and FIG. 5, alone the cutting line DD', the gate structure layer 102 is on the silicon layer 100 of substrate, in an example, covering over the trench isolation structure 50 and the doped region 122 of the silicon layer 100. As viewed from FIG. 5, the first region 102a of the gate structure layer 102 is N type with the dopant concentration N+. As to the second region 102b of the gate structure layer 102, according to the arrangement of the first doped region 104 and the second doped region 106, the interface thereof is located within the second region 102b, and then the second region 102b is divided into two portion 112a, 112b. The portion 112b is abutting to the first region 102a of the gate structure layer 102 and have dopant concentration N+. The portion 112a is the end part of the gate structure layer 112, the conductive type with the dopant concentration is represented as P+, which is determined according to doping at the at the second doped region 106. Thus, an NP junction is formed in the second region 102b of the gate structure layer 102, and may provide the resistance effect for transistor during operation.

Here, the doped region 114 of the silicon layer 100 in location is belonging to a part of the second doped region 106, as implanted by the P dopants with the dopant concentration represented as P+. A large portion for the doped region 122 as covered by the gate structure layer 102 remains the concentration P as preliminarily doped, which is relatively less than the concentration P+. Since the concentration P+ is higher than the concentration P, a diffusion region 118 may be formed at the interface with the concentration represented by P− between the concentration P+ and the concentration P. Thus, the performance of the transistor may be further improved.

In an embodiment, the NP junction structure is formed in the second region 102b of the gate structure layer 102. During operation, in accordance with the voltages as applied to the doped region 114 through the connection structure 116, it may provide the resistor effect, so that the channel may get more stable, such as improving stability for the threshold voltage, and then the performance of transistor may be improved.

Further, the NP junction structure as formed the second region 102b of the gate structure layer 102 may remain the same line width for the gate structure layer 102. There is no need to laterally extend out causing occupying more device area. As to the transistor structure which in an example may be applied to the circuit of memory device, which usually involves a large number of logic devices in the circuit, the total area as used may be effectively reduced.

Figure 6:
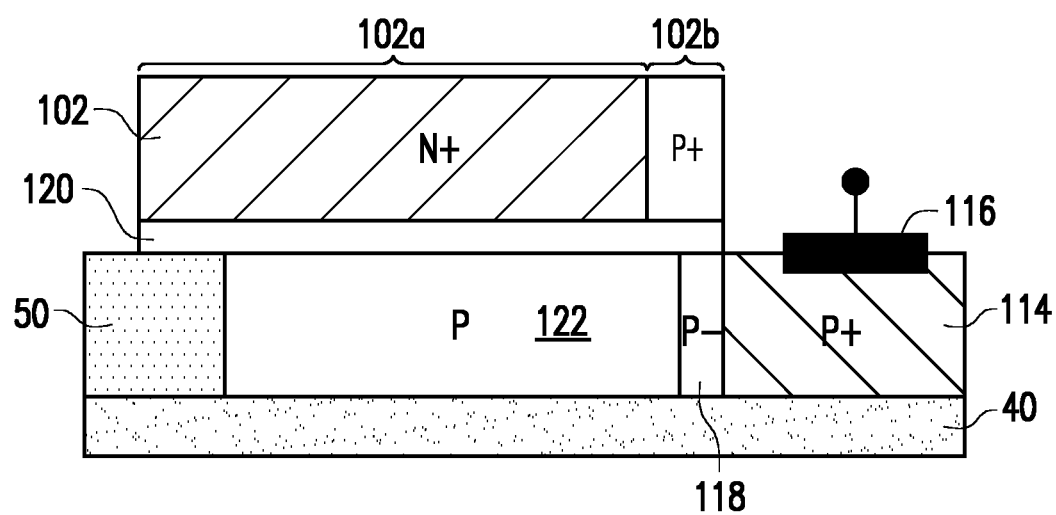
FIG. 6 is a drawing, schematically illustrating a cross-sectional structure of field effect transistor, according to an embodiment of the invention.

In an embodiment, the manner to form the NP junction structure in the second region 102b of the gate structure layer 102 is not just limited to the embodiments as provided. FIG. 6 is a drawing, schematically illustrating a cross-sectional structure of field effect transistor, according to an embodiment of the invention.

Referring to FIG. 6, based on the structure in FIG. 5, it may have other manner to the NP junction structure at the second region 102b of the gate insulating layer 102. In an example, all the second region 102b may be doped as P+. In other words, as an example, the first region 102a and the second region 102b of the gate structure layer 102 may be different in conductive type, and the interface also forms the NP junction. The second region 102b of the gate structure layer 102 may have the cross-sectional structure as shown in FIG. 3. The second region 102b of the gate structure layer 102 may still cover a portion of the trench isolation structure 50 at the two sides.

The invention provides the field effect transistor, voltage operation terminals thereof may include four terminals of source electrode, drain electrode, gate electrode and base electrode. The gate structure in accordance with the base electrode in operation may additionally form the NP junction structure, so to provide the resistor effect. The NP junction may remain the same line width of the gate structure, without substantially increasing the use of device area.

In addition, the foregoing description is taking the N-type field effect transistor as an example but it may also be suitable for forming the P-type field effect transistor. The conductive types may be exchanged, including the formation of the PN junction at the second region 102b of the gate structure layer. The NP junction structure and PN junction structure may be generally referred as a conductive-type junction structure.

Further as described in fabrication process, the invention may also provide a method for fabricating a field-effect transistor. The method includes providing a silicon layer, wherein a portion of silicon layer is between adjacent two trench isolation structures. Further, a gate structure layer in a line shape is formed on the silicon layer, including a first region and a second region abutting to the first region, the second region of the gate structure layer overlapping with and covering on the silicon layer and the trench isolation structures. The trench isolation structures are in the silicon layer and at two sides of the gate structure layer corresponding to the second region, wherein the second region of the gate structure layer has a first portion and a second portion sequentially from the first region. A first implanting process is performed to implant first-type dopants at least into the second portion of the second region of the gate structure layer. A second implanting process is performed to implant second-type dopants into the silicon layer to form source and second regions and to implant the second-type dopants into the first region and the first portion of the second region of the gate structure layer, wherein the gate structure layer except the second portion of the second region is also implanted to form a conductive-type junction portion at the second region.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A structure of field-effect transistor, comprising:
a silicon layer of a silicon-on-insulator structure;
a gate structure layer in a line shape, disposed on the silicon layer, wherein the gate structure layer includes a first region and a second region abutting to the first region;
trench isolation structures in the silicon layer, disposed at two sides of the gate structure layer and corresponding to the second region, wherein the second region of the gate structure layer is on the silicon layer and overlaps at least with one trench isolation structure; and
a source region and a drain region, disposed in the silicon layer at the two sides of the gate structure layer, accordingly, being adjacent to the first region,
wherein the first region and the second region of the gate structure layer are in different conductive type,
wherein a width of the silicon layer under the second region of the gate structure layer is smaller than a width of the gate structure layer.

* * * * *